US010755191B2

(12) United States Patent
Shim et al.

(10) Patent No.: US 10,755,191 B2
(45) Date of Patent: Aug. 25, 2020

(54) SYSTEMS, METHODS, AND DEVICES FOR NOISE-INSENSITIVE QUBIT GATE OPERATIONS

(71) Applicant: University of Maryland, College Park, College Park, MD (US)

(72) Inventors: Yun-Pil Shim, Eldersburg, MD (US); Charles George Tahan, Silver Spring, MD (US)

(73) Assignees: University of Maryland, College Park, College Park, MD (US); The United States of America, as represented by the Director, National Security Agency, Washington, DC (US)

(*) Notice: Subject to any disclaimer, the term of this patent is extended or adjusted under 35 U.S.C. 154(b) by 515 days.

(21) Appl. No.: 15/419,743

(22) Filed: Jan. 30, 2017

(65) Prior Publication Data

US 2020/0027017 A1    Jan. 23, 2020

Related U.S. Application Data

(60) Provisional application No. 62/288,569, filed on Jan. 29, 2016.

(51) Int. Cl.
*G06N 10/00* (2019.01)
*H01L 29/66* (2006.01)

(52) U.S. Cl.
CPC ........ *G06N 10/00* (2019.01); *H01L 29/66439* (2013.01)

(58) Field of Classification Search
CPC ... G06N 99/002; B82Y 10/00; Y10S 977/933; H01L 27/18; H01L 39/223–39/226; H03K 17/92; H03K 3/38
See application file for complete search history.

(56) References Cited

U.S. PATENT DOCUMENTS

| | | | | |
|---|---|---|---|---|
| 7,307,275 | B2* | 12/2007 | Lidar | B82Y 10/00 257/31 |
| 2008/0237576 | A1* | 10/2008 | Hawrylak | G06N 10/00 257/24 |
| 2017/0116542 | A1* | 4/2017 | Shim | G06N 10/00 |
| 2017/0141286 | A1* | 5/2017 | Kerman | G06N 10/00 |
| 2017/0206461 | A1* | 7/2017 | Friesen | G06N 10/00 |

OTHER PUBLICATIONS

Physical Review B 90, 165427 (2014) (Year: 2014).*
Chang-Yu Hsieh et al 2012 Rep. Prog. Phys. 75 114501 (Year: 2012).*

(Continued)

Primary Examiner — Jarrett J Stark
(74) Attorney, Agent, or Firm — Klarquist Sparkman, LLP

(57) ABSTRACT

An always-on, exchange-only (AEON) qubit is comprised of three two-level systems (e.g., semiconductor quantum dot or other spin encoded qubit) and can be operated at a "sweet spot" during both single qubit and two-qubit gate operations. The "sweet spot" operation is immune to variations in noise with respect to nontrivial detuning parameters defining the AEON. By operating at the "sweet spot," both single and two-qubit gate operations can be performed using only exchange pulses (e.g., DC voltage pulses applied to tunneling gates).

16 Claims, 4 Drawing Sheets

(56) References Cited

OTHER PUBLICATIONS

Hensgens, T. et al. Quantum simulation of a Fermi-Hubbard model using a semiconductor quantum dot array. Nature 548, 70-73 (2017 (Year: 2017).*
Awschalom et al., "Quantum spintronics: Engineering and manipulating atom-like spins in semiconductors," *Science*, Mar. 2013, 339: pp. 1174-1179.
Dial et al., "Charge noise spectroscopy using coherent exchange oscillations in a singlet-triplet qubit," *Physical Review Letters*, 2013, 110(14): 146804.
Divincenzo et al., "Universal quantum computation with exchange interaction," arXiv:quant-ph/0005116v2 [online], May 2002 [retrieved on Jul. 12, 2017]. Retrieved from the Internet: <URL: https://arxiv.org/abs/quant-ph/0005116v2>.
Doherty et al., "Two-qubit gates for resonant exchange qubits," *Physical Review Letters*, 2013, 111(5): 050503.
Duan et al., "Preserving coherence in quantum computation by pairing quantum bits," *Physical Review Letters*, Sep. 1997, 79(10): pp. 1953-56.
Fei et al., "Characterizing gate operations near the sweet spot of an exchange-only qubit," *Physical Review B*, 2015, 91(20): 205434.
Fong et al., "Universal quantum computation and leakage reduction in the 3-qubit decoherence free subsystem," arXiv:1102.2909v1 [online], Feb. 2011 [retrieved on Feb. 12, 2017]. Retrieved from the Internet: <URL: https://arxiv.org/abs/1102.2909v1>.
Hanson et al., "Universal set of quantum gates for double-dot spin qubits with fixed interdot coupling," *Physical Review Letters*, 2007, 98(5): 050502.
Hsieh et al., "An explicit universal gate-set for exchange-only quantum computation," arXiv:quant-ph/0309002v2 [online], Dec. 2003 [retrieved on Jul. 12, 2017]. Retrieved from the Internet: <URL: https://arxiv.org/abs/quant-ph/0309002v2>.
Hu et al., "Charge-fluctuation-induced dephasing of exchange-coupled spin qubits," *Physical Review Letters*, 2006, 96(10): 100501.
Kane, B.E., "A silicon-based nuclear spin quantum computer," *Nature*, May 1998, 393: pp. 133-37.
Koch et al., "Charge insensitive qubit design derived from the Cooper pair box," arXiv:cond-mat/0703002v2 [cond-mat.mes-hall] [online], Sep. 2007 [retrieved on Jul. 12, 2017]. Retrieved from the Internet: <URL: https://arxiv.org/abs/cond-mat/0703002v2>.
Levy, J., "Universal quantum computation with spin-1/2 pairs and Heisenberg exchange," *Physical Review Letters*, Sep. 2002, 89(14): 147902.
Lidar et al., "Decoherence free subspaces for quantum computation," arXiv:quant-ph/9807004v2 [online], Jul. 1998, [retrieved on Jul. 12, 2017]. Retrieved from the Internet: <URL: https://arxiv.org/abs/quant-ph/9807004v2>.
Loss et al., "Quantum computation with quantum dots," *Physical Review A*, Jan. 1998, 57(1): pp. 120-26.
Maune et al., "Coherent singlet-triplet oscillations in a silicon-based double quantum dot," *Nature*, Jan. 2012, 481: pp. 344-47.
Medford et al., "Quantum-dot-based resonant exchange qubit," *Physical Review Letters*, 2013, 111(5): 050501.
Medford et al., "Self-consistent measurement and state tomography of an exchange-only spin qubit," *Nature Nanotechnology*, Sep. 2013, 8: pp. 654-59.
Mehl et al., "Simple operation sequences to couple and interchange quantum information between spin qubits of different kinds," *Physical Review B*, 2015, 92(11): 115448.
Petta et al, "Coherent manipulation of coupled electron spins in semiconductor quantum dots," *Science*, Sep. 2005, 309: pp. 2180-84.
Reed et al., "Reduced sensitivity to charge noise in semiconductor spin qubits via symmetric operation," *Physical Review Letters*, 2016, 116(11): 110402.
Russ et al., "Asymmetric resonant exchange qubit under the influence of electrical noise," *Physical Review B*, 2015, 91(23): 235411.
Schrieffer et al., "Relation between the Anderson and Kondo Hamiltonians," *Physical Review*, Sep. 1966, 149(2): pp. 491-492.
Shim et al., "Single-qubit gates in two steps with rotation axes in a single plane," arXiv:1303.0297v1 [cond-mat.mes-hall] [online], Mar. 2013 [retrieved on Jul. 12, 2017]. Retrieved from the Internet: <URL: https://arxiv.org/abs/1303.0297>.
Shulman et al., "Demonstration of entanglement of electrostatically coupled singlet-triplet qubits," *Science*, Apr. 2012, 336: pp. 202-205.
Taylor et al., "Electrically protected resonant exchange qubits in triple quantum dots," *Physical Review Letters*, 2013, 111(5): 050502.
Vion et al., "Manipulating the quantum state of an electrical circuit," *Science*, May 2002, 296: pp. 886-89.
Zanardi et al., "Noiseless quantum codes," arXiv:quant-ph/9705044v2 [online], Sep. 1997, [retrieved on Jul. 12, 2017]. Retrieved from the Internet: < URL: https://arxiv.org/abs/quant-ph/9705044v2>.
Doherty et al., "Two-qubit gates for resonant exchange qubits," arXiv:1304.3416v2 [cond-mat.mes-hall] [online], Apr. 2013 [retrieved on Jan. 26, 2017]. Retrieved from the Internet:<URL: https://arxiv.org/abs/1304.3416>.
Eng et al., "Isotropically enhanced triple-quantum-dot qubit," *Science Advances* [online], May 2015, [retrieved on Jan. 18, 2017]. Retrieved from the Internet:<URL: http://advances.sciencemag.org/content/1/4/e1500214>.
Fei et al., "Characterizing gate operations near the sweet spot of an exchange-only qubit," arXiv:1412.1503v2 [cond-mat.mes-hall] [online], Mar. 2015 [retrieved on Jan. 26, 2017]. Retrieved from the Internet:<URL: https://arxiv.org/abs/1412.1503>.
Laird et al., "Coherent spin manipulation in an exchange-only qubit," *Physical Review B*, 2010, 82(075403).
Martins et al, "Noise suppression using symmetric exchange gates in spin qubits," arXiv:1511.07336v2 [cond-mat.mes-hall] [online], Feb. 2016 [retrieved on Jan. 26, 2017]. Retrieved from the Internet:<URL: https://arxiv.org/abs/1511.07336>.

* cited by examiner

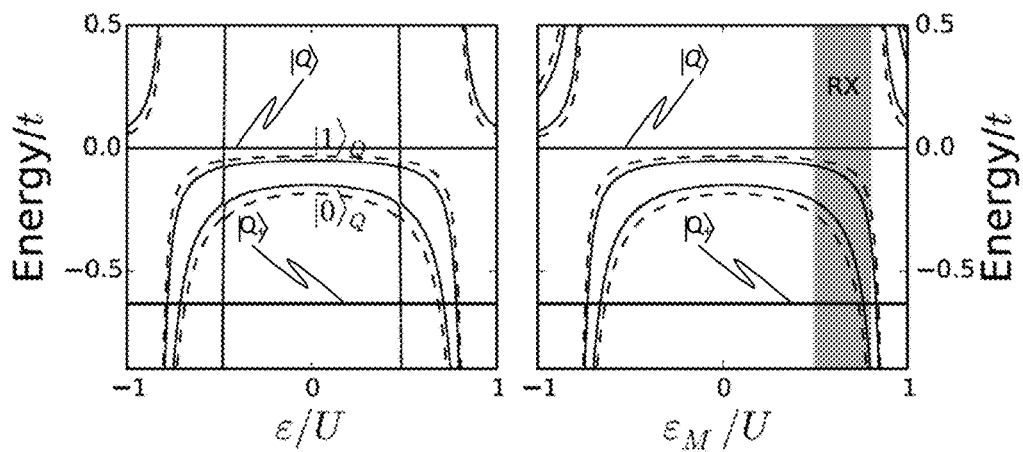
FIG. 2A  FIG. 2D
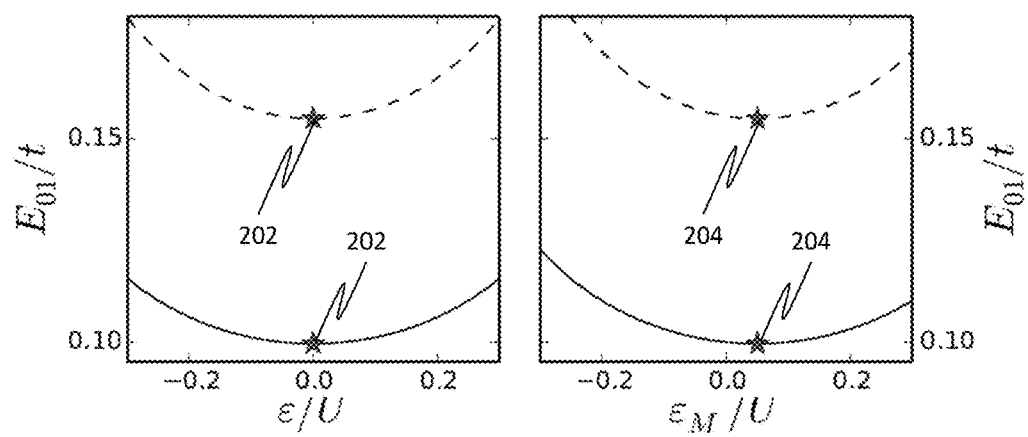
FIG. 2B  FIG. 2E
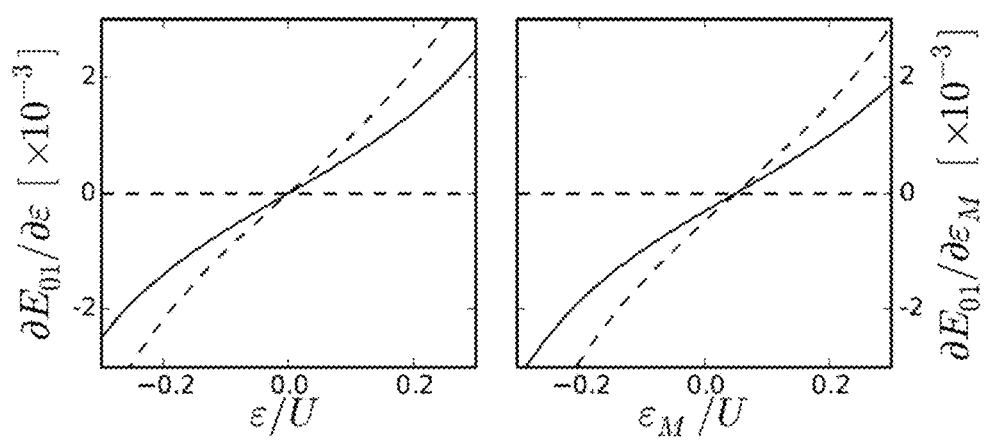
FIG. 2C  FIG. 2F

SYSTEMS, METHODS, AND DEVICES FOR NOISE-INSENSITIVE QUBIT GATE OPERATIONS

CROSS-REFERENCE TO RELATED APPLICATIONS

The present application claims the benefit of U.S. Application No. 62/288,569, filed Jan. 29, 2016, which is hereby incorporated by reference herein in its entirety.

STATEMENT REGARDING FEDERALLY SPONSORED RESEARCH

This invention was made with government support under H9823011C0301 awarded by the National Security Agency (NSA). The government has certain rights in the invention.

FIELD

The present disclosure generally relates to quantum computing using qubits, and, more particularly, to systems, devices, and methods for qubit gate operations while minimizing, or at least reducing, sensitivity to noise.

BACKGROUND

Semiconductor qubits remain a leading candidate technology for quantum information processing. In such qubits, spins can have extremely long quantum coherence due to a decoupling of spin information from charge noise in many materials. Moreover, semiconductor qubits can be relatively small, thereby enabling high density. However, semiconductor qubits typically rely on microwave pulse control in performing one or more gate operations, which can result in slow gates with significant potential for crosstalk with nearby qubits.

In some semiconductor qubit systems, the exchange interaction has been used to provide a natural and fast method for entangling semiconductor qubits. The exchange interaction can be used to perform two-spin entangling operations with a finite-length voltage pulse or to couple spins with a constant interaction. Exchange also provides a solution to the control problem by allowing a two-level system to be encoded into the greater Hilbert space of multiple physical spins.

Decoherence free subspaces and subsystems (DFS) were developed based on this exchange interaction, and many multi-spin-based qubits have been proposed and demonstrated with various desirable properties for quantum computing based on the exchange interaction concept. Such examples include 2-DFS (also known as "singlet-triplet" qubit), 3-DFS (also known as "exchange-only" qubit), and 4-DFS qubits. Such DFS configurations can allow for gate operations via a sequence of pair-wise exchange interactions between spins with fast, baseband voltage control of metallic top-gates. While these DFS configurations are immune to global field fluctuations to some extent, their fidelity is limited by charge noise, since charge and spin are coupled when spins undergo exchange.

Another proposed multi-spin qubit, known as a "resonant exchange" (RX) qubit, employs an encoded qubit made of 3 quantum dots (QD) with "always-on" exchange interactions. For the RX qubit, the triple QD device is tuned to be in a regime where the (111) configuration is close to (201) and (102) configurations for initialization and readout. This implies that $\varepsilon_M$ is relatively large, comparable to the on-site Coulomb interaction U (see RX regime shaded in gray in FIG. 2D). In other words, the middle QD has a much higher chemical potential (i.e., local potential) than the respective chemical potentials for the outer QDs. As a result, the RX qubit is only partially insensitive to noise.

For example, the first derivative of the RX qubit frequency vanishes for one of the two detuning parameters that are affected by charge noise. The qubit is maintained at this parameter space while microwave control allows for single qubit operations "resonant" with the gap of the 3-spin system. For two qubit gates, the RX qubit offers a relatively large transition dipole matrix element for two-qubit dipole-dipole coupling, either directly or through a resonator. Unfortunately, complete insensitivity for an RX qubit with respect to both detuning parameters (e.g., $\varepsilon$ and $\varepsilon_M$) only lies outside of the (111) singly occupied regime, where higher order effects otherwise limit the coherence of the qubit.

Furthermore, the partial insensitivity of the RX qubit depends on the asymmetry of the tunnel coupling between the QDs of the qubit, requiring a different method (i.e., microwave control) to implement full single qubit rotations. Thus, the logical single qubit gate operations are implemented using microwave at a partially insensitive parameter location defined by the tunnel coupling between QDs.

Embodiments of the disclosed subject matter may address one or more of the above-noted problems and disadvantages, among other things.

SUMMARY

In embodiments, always-on, exchange-only (AEON) qubits, each comprised of three two-level systems (TLS), can be operated at a multi-dimensional "sweet spot" to provide single qubit gate operations and two-qubit gate operations. Each TLS can be, in embodiments, a semiconductor QD or other spin encoded qubit. For the AEON qubit, the triple QD device can be tuned to be in a deep (111) regime, where energies of the QDs are of similar values as compared to the Coulomb interaction energy. Operating at this multi-dimensional "sweet spot" with respect to environmental parameters (which may otherwise inflict noise on the qubit), both single and two-qubit gate operations can be performed using only exchange pulses (e.g., DC voltage pulses applied to tunneling gates), in contrast to prior qubit systems that operate at a location in parameter space that may be only partially insensitive to noise and/or employ other control methodologies besides gate pulses (e.g., microwave control).

In one or more embodiments, a method comprises performing a single qubit gate operation on a three-spin qubit or a two-qubit gate operation on adjacent three-spin qubits. Each qubit can be characterized by a pair of non-trivial detuning parameters representing energy differences between respective energy levels of the two-level systems of the qubit. In performing the single qubit gate operation or the two-qubit gate operation, local potentials of two-level systems of each qubit can be controlled such that derivatives of a respective frequency of the qubit with respect to each detuning parameter are within $10^{-3}$ of zero, and tunnel couplings between adjacent two-level systems of each qubit are controlled to be non-zero.

In one or more embodiments, a system comprises a three-spin qubit and a controller. The three-spin qubit can have first through third two-level systems with respective local potentials $\varepsilon_1$ through $\varepsilon_3$. The controller can be configured to control the qubit in performing a single qubit gate operation or a two-qubit gate operation. The qubit can be characterized by a pair of non-trivial detuning parameters representing energy differences between respective energy levels of the two-level systems of the qubit. The controller can also be configured to control local potentials of the two-level systems of the qubit such that derivatives of a respective frequency of the qubit with respect to each detuning parameter are within $10^{-3}$ of zero, and to control tunnel couplings between adjacent two-level systems of each qubit to be nonzero.

In one or more embodiments, a method comprises controlling respective local potentials, $\varepsilon_1$ through $\varepsilon_3$, of first through third two-level systems of a three-spin qubit while maintaining tunnel couplings between adjacent two-level systems of the qubit in an on-state, such that $$\varepsilon = \frac{1}{4}(-\tilde{U}_1 + \tilde{U}'_2 - \tilde{U}_2 + \tilde{U}_3) \pm 0.1 U_{av}, \text{ and}$$

$$\varepsilon_M = \frac{1}{4}(\tilde{U}_1 - \tilde{U}'_2 - \tilde{U}_2 + \tilde{U}_3) \pm 0.1 U_{av},$$

where $\varepsilon = \dfrac{\varepsilon_1 - \varepsilon_3}{2}$ and $\varepsilon_M = \varepsilon_2 - \dfrac{\varepsilon_1 + \varepsilon_3}{2}$.

The second two-level system can be adjacent to both the first and third two-level systems. $\tilde{U}_i$ represents a change in Coulomb interaction energy when an i-th two-level system is doubly occupied by tunneling of an electron from an adjacent two-level system. $U_{av}$ is the average of value of $\tilde{U}_1$, $\tilde{U}_2$, $\tilde{U}'_2$, and $\tilde{U}_3$. $\tilde{U}'_2$ corresponds to when the second two-level system is doubly occupied by tunneling of an electron from the first two-level system, and $\tilde{U}_2$ corresponds to when the second two-level system is doubly occupied by tunneling of an electron from the third two-level system.

Objects and advantages of embodiments of the disclosed subject matter will become apparent from the following description when considered in conjunction with the accompanying drawings.

BRIEF DESCRIPTION OF THE DRAWINGS

Embodiments will hereinafter be described with reference to the accompanying drawings, which have not necessarily been drawn to scale. Where applicable, some features may not be illustrated to assist in the illustration and description of underlying features. Throughout the figures, like reference numerals denote like elements.

FIG. 2A is a graph illustrating the energy spectrum of a three-spin qubit as a function of $\varepsilon$, with $\varepsilon_M$ being fixed at 0.05 U.

FIG. 2B is a graph illustrating energy gap of the effective Hamiltonian in qubit space for the three-spin qubit as a function of $\varepsilon$, with $\varepsilon_M$ being fixed at 0.050.

FIG. 2C is a graph illustrating the derivative of the energy gap of FIG. 2B with respect to $\varepsilon$.

FIG. 2D is a graph illustrating the energy spectrum of a three-spin qubit as a function of $\varepsilon_M$, with $\varepsilon$ being fixed at 0.

FIG. 2E is a graph illustrating energy gap of the effective Hamiltonian in qubit space for the three-spin qubit as a function of $\varepsilon_M$, with $\varepsilon$ being fixed at 0.

FIG. 2F is a graph illustrating the derivative of the energy gap of FIG. 2E with respect to $\varepsilon_M$.

DETAILED DESCRIPTION

Disclosed herein are novel methods for performing gate operations on qubits, as well as quantum computing systems incorporating such methods. In particular, the disclosed methods seek to minimize, or at least reduce, noise sensitivity (e.g., charge noise sensitivity) of the qubit during operations (including gate operations, or idle (i.e., no operation)) by operating the qubit on a "sweet spot" with respect to multiple environmental parameters.

In embodiments, always-on, exchange-only (AEON) qubits, each comprised of three two-level systems (TLS), can be operated at a "sweet spot" to provide single qubit gate operations and two-qubit gate operations. As used herein, "sweet spot" refers to a location in parameter space where certain system properties (e.g., the energy gap of the effective Hamiltonian) are minimally affected by certain environmental changes (i.e., charge noise and other noise), at least to the first order. Each TLS can be, in embodiments, a semiconductor QD or other spin encoded qubit. By operating at the "sweet spot," both single and two-qubit gate operations can be performed using only exchange pulses (e.g., DC voltage pulses applied to tunneling gates) while maintaining insensitivity to environmental changes.

In embodiments, the AEON qubit can have both exchange interactions maintained on for logical gate operations while remaining on the sweet spot, which is independent of the tunneling elements (e.g., coupling between QDs of the AEON qubit). In other words, the tunneling barrier between QDs is tuned directly to control the exchange interaction, as opposed to changing the relative energy-level detuning between two QDs. The exchange operation via gate-tuning the tunneling barrier near the symmetric operating point (SOP) of the detuning leads to much higher fidelity during the exchange operations than control of the exchange interaction by tilting (detuning) QDs.

Figure 1A:
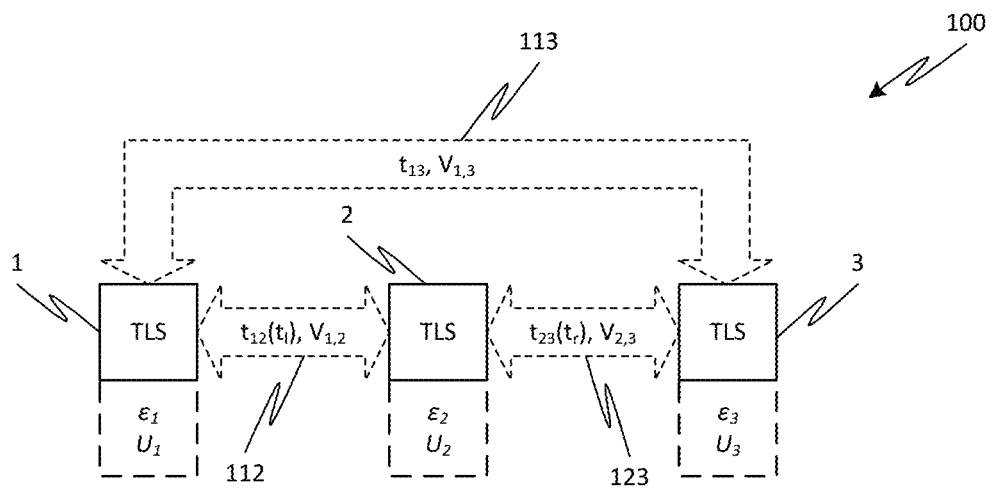
FIG. 1A is a simplified schematic diagram illustrating two-level systems of and variables associated with a three-spin qubit, according to one or more embodiments of the disclosed subject matter.

Referring to FIG. 1A, an exemplary system for an AEON qubit 100 is shown. The AEON qubit can include a first TLS 1, a second TLS 2, and a third TLS 3, all of which are serially arranged. Although shown as a linear array, the TLSs of the AEON 100 can be arranged along non-linear geometries, for example, in a V- or U-shape. Each TLS 1-3 can be, for example, a QD, such as a semiconductor QD (e.g., QD formed in GaAs, Si, or any other semiconductor). Each TLS i (where i=1, 2, 3) can have a respective local potential (e.g., dot energy) $\varepsilon_i$ and a respective on-site Coulomb interaction energy $U_i$, and can have coupling between each other ij (where i,j=1, 2, 3) defined by tunnel coupling $t_{ij}$ and cross Coulomb interaction energy $V_{ij}$, as shown in FIG. 1A.

The AEON qubit 100 of FIG. 1A can be described by a Hubbard Hamiltonian:

$$\hat{H} = \sum_{i=1}^{3}\sum_{\sigma} \varepsilon_i c_{i\sigma}^{\dagger} c_{i\sigma} + \sum_{i=1}^{3} U_i \hat{n}_{i\uparrow} \hat{n}_{i\downarrow} + \frac{1}{2}\sum_{i\neq j} V_{ij} \hat{n}_i \hat{n}_j + \sum_{\langle i,j \rangle}\sum_{\sigma} t_{ij}\left(c_{i\sigma}^{\dagger} c_{j\sigma} + h.c.\right) \quad (1)$$

where $\hat{n}_i = \hat{n}_{i\uparrow} + \hat{n}_{i\downarrow}$ and $\hat{n}_{i\sigma} = c_{i\sigma}^{\dagger} c_{i\sigma}$. Considering $t_{13}=0$, which may be the case when the AEON qubit 100 adopts a linear configuration for TLSs 1-3 or in other configurations may be substantially close to 0, the other tunneling elements can be labeled as $t_{12}=t_l$ and $t_{23}=t_r$.

The following new parameters can be defined for orbital energies of the QDs:

$$\bar{\varepsilon} = \frac{\varepsilon_1 + \varepsilon_2 + \varepsilon_3}{3} \quad (1A)$$

$$\varepsilon = \frac{\varepsilon_1 - \varepsilon_3}{2} \quad (1B)$$

$$\varepsilon_M = \varepsilon_2 - \frac{\varepsilon_1 + \varepsilon_3}{2} \quad (1C)$$

Figure 1B:
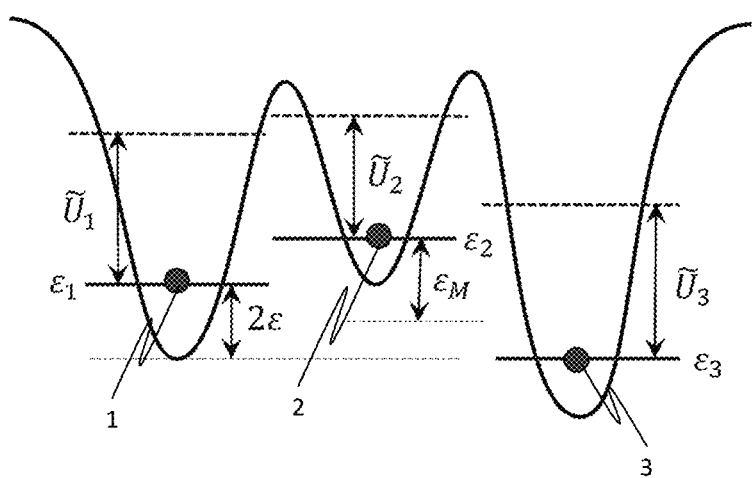
FIG. 1B is a schematic diagram illustrating energy levels of a three-spin qubit, according to one or more embodiments of the disclosed subject matter.

There are two independent (non-trivial) detuning parameters that are affected by the charge noise, as defined by Eqns. (1b) and (1c). Note that in Eqn. (1a), $\bar{\varepsilon}$ just shifts the global energy reference and does not affect the qubit operations. As illustrated in the energy level schematic of FIG. 1B, $\varepsilon$ is the detuning between TLS 1 and TLS 3, and $\varepsilon_M$ is the detuning of TLS 2 with respect to the average of the other two dots, as shown in FIG. 1B. Note that the differences in energy levels of the QDs 1-3 have been exaggerated in FIG. 1B for purposes of illustration. Thus, in embodiments each other, the local potentials may be substantially identical (i.e., $\varepsilon_1 \sim \varepsilon_2 \sim \varepsilon_3$) to each other, for example, within 0.1 $U_{av}$ of each other, where $U_{av}$ represents an average of the on-site Coulomb interaction energies, $U_i$, of QDs 1-3 (or alternatively, an average of the Coulomb interaction energies, $\tilde{U}_i$, of QDs 1-3 when the QD is doubly occupied by tunneling of an electron from an adjacent QD).

These two detunings (i.e., $\varepsilon$ and $\varepsilon_M$) affect the qubit coherence. The tunneling elements $t_l$ and $t_r$ may also be susceptible to charge noise, but any fluctuation in the tunnel couplings is not a dominant source of dephasing when compared to the fluctuation in the detunings. Therefore, "sweet spots" are when the derivative of the qubit energy vanishes (or is sufficiently close to 0, for example, within $10^{-3}$ of 0) with respect to the detunings $\varepsilon$ and $\varepsilon_M$.

In embodiments, the AEON qubit 100 has three singly (or total spin-1/2) occupied QDs 1-3. The exchange interaction arises by virtually occupying one of the QDs through tunneling. The relevant charge configurations are (111), (201), (102), (120), (021), (210), (012) where the digits signify the number of electrons in each QD. Two configurations, (210) and (012), are not tunnel coupled to (111) and contribute only higher order corrections and can be neglected in the following.

Total spin $S_{tot}$ is a good quantum number of the Hubbard Hamiltonian. Focusing on the low energy manifold with $S_{tot}=\frac{1}{2}$, and with a uniform external field, Zeeman splitting allows further limiting of the subspace with $S_{tot}^z=\frac{1}{2}$ for the Zeeman energy much larger than the exchange interaction. Selecting a set of basis states for charge configurations of (111), (201), (102), (120), and (021) yields:

$$|1\rangle = |S\rangle_{13}|\uparrow\rangle_2 = \frac{1}{\sqrt{2}}[|\uparrow_1 \uparrow_2 \downarrow_3\rangle - |\downarrow_1 \uparrow_2 \uparrow_3\rangle] \quad (2)$$

$$|2\rangle = -\frac{1}{\sqrt{3}}|T_0\rangle_{13}|\uparrow\rangle_2 + \sqrt{\frac{2}{3}}|T_+\rangle_{13}|\downarrow\rangle_2 =$$
$$-\frac{1}{\sqrt{6}}[|\uparrow_1 \uparrow_2 \downarrow_3\rangle + |\downarrow_1 \uparrow_2 \uparrow_3\rangle - 2|\uparrow_1 \downarrow_2 \uparrow_3\rangle]$$

$$|3\rangle = (201) = |S\rangle_{11}|\uparrow\rangle_3 = |\uparrow_1 \downarrow_1; \uparrow_3\rangle$$

$$|4\rangle = (102) = |\uparrow\rangle_1|S\rangle_{33} = |\uparrow_1; \uparrow_3 \downarrow_3\rangle$$

$$|5\rangle = (120) = |\uparrow\rangle_1|S\rangle_{22} = |\uparrow_1; \uparrow_2 \downarrow_2\rangle$$

$$|6\rangle = (021) = |S\rangle_{22}|\uparrow\rangle_3 = |\uparrow_2 \downarrow_2; \uparrow_3\rangle,$$

and the Hamiltonian matrix is given by:

$$H = E_0 + \begin{pmatrix} 0 & 0 & \frac{t_l}{\sqrt{2}} & \frac{t_r}{\sqrt{2}} & \frac{t_r}{\sqrt{2}} & \frac{t_l}{\sqrt{2}} \\ 0 & 0 & \frac{\sqrt{6}}{2}t_l & -\frac{\sqrt{6}}{2}t_r & -\frac{\sqrt{6}}{2}t_r & \frac{\sqrt{6}}{2}t_l \\ \frac{t_l}{\sqrt{2}} & \frac{\sqrt{6}}{2}t_l & \varepsilon - \varepsilon_M + \tilde{U}_1 & 0 & 0 & 0 \\ \frac{t_r}{\sqrt{2}} & -\frac{\sqrt{6}}{2}t_r & 0 & -\varepsilon - \varepsilon_M + \tilde{U}_3 & 0 & 0 \\ \frac{t_r}{\sqrt{2}} & -\frac{\sqrt{6}}{2}t_r & 0 & 0 & \varepsilon + \varepsilon_M + \tilde{U}_2 & 0 \\ \frac{t_l}{\sqrt{2}} & \frac{\sqrt{6}}{2}t_l & 0 & 0 & 0 & -\varepsilon + \varepsilon_M + \tilde{U}_2' \end{pmatrix}, \quad (3)$$

-continued where $$E_0 = 3\bar{\varepsilon} + V_{12} + V_{23} + V_{13} \quad (3A)$$

$$\tilde{U}_1 = U_1 - V_{12} - V_{23} + V_{13} \quad (3B)$$

$$\tilde{U}_2 = U_2 + V_{12} - V_{23} - V_{13} \quad (3C)$$

$$\tilde{U}'_2 = U_2 - V_{12} + V_{23} - V_{13} \quad (3D)$$

$$\tilde{U}_3 = U_3 - V_{12} - V_{23} + V_{13}. \quad (3E)$$

$\tilde{U}_i$'s are the Coulomb interaction energy changes when i-th dot is doubly occupied by tunneling of an electron from an adjacent dot. $\tilde{U}_2$ is for tunneling from the right dot, i.e., (120) configuration, and $\tilde{U}'_2$ is for tunneling from the left dot, i.e., (021) configuration.

Assuming $U_i \gg V_{ij} \gg t_l$, $t_r$ and that the AEON qubit 100 is in resonant regime where $|\varepsilon|$, $|\varepsilon_M| \ll \tilde{U}_i$, then a Schrieffer-Wolff transformation can be performed to obtain an effective Hamiltonian in a subspace spanned by two qubit states $\{|0\rangle = |2\rangle, |1\rangle_Q = |1\rangle\}$ $$\hat{H}_{eff} = \left(E_0 - \frac{J_l + J_r}{2}\right)\mathbb{1} - \frac{J}{2}\hat{\sigma}_z - \frac{\sqrt{3}\,j}{2}\hat{\sigma}_x \quad (4)$$

where $J = \frac{J_l + J_r}{2}$ and $j = \frac{J_l - J_r}{2}$.

The exchange interactions between QDs 1 and 2 ($J_l$) and QDs 2 and 3 ($J_r$) can be defined as:

$$J_l = 2t_l^2 \frac{(\tilde{U}_1 + \tilde{U}'_2)}{f_l(\varepsilon, \varepsilon_M)} \quad (4A)$$

$$J_r = 2t_r^2 \frac{(\tilde{U}_2 + \tilde{U}_3)}{f_r(\varepsilon, \varepsilon_M)} \quad (4B)$$

$$f_l(\varepsilon, \varepsilon_M) = \tilde{U}_1 \tilde{U}'_2 - (\tilde{U}_1 - \tilde{U}'_2)(\varepsilon - \varepsilon_M) - (\varepsilon - \varepsilon_M)^2 \quad (4C)$$

$$f_r(\varepsilon, \varepsilon_M) = \tilde{U}_2 \tilde{U}_3 - (\tilde{U}_2 - \tilde{U}_3)(\varepsilon + \varepsilon_M) - (\varepsilon + \varepsilon_M)^2 \quad (4D)$$

Note that Eqn. (4) is equivalent to exchange-coupled Heisenberg Hamiltonian:

$$\hat{H}_{eff} = E_0 \mathbb{1} + J_l \hat{s}_1 \cdot \hat{s}_2 + J_r \hat{s}_2 \cdot \hat{s}_3 \quad (4E)$$

where $\hat{s}_j$ is the spin operator for the electron spin in j-th QD.

The sweet spots are defined where the energy gap of the effective Hamiltonian in the qubit space Eqn. (4) is insensitive to the charge noise in detuning parameters up to first order. That is, where $\varepsilon_{01} \cdot \sqrt{J^2 + 3j^2} = \sqrt{J_l^2 + J_r^2 - J_l J_r}$ is immune to small variations in the parameters $\varepsilon$ and $\varepsilon_M$. From $$\frac{\partial E_{01}}{\partial \varepsilon} = \frac{\partial E_{01}}{\partial \varepsilon_M} = 0,$$

the sweet spot is defined as:

$$\varepsilon = \frac{1}{4}(-\tilde{U}_1 + \tilde{U}'_2 - \tilde{U}_2 + \tilde{U}_3), \text{ and} \quad (5)$$

$$\varepsilon_M = \frac{1}{4}(\tilde{U}_1 - \tilde{U}'_2 - \tilde{U}_2 + \tilde{U}_3), \quad (6)$$

Alternatively, the sweet spot can be obtained from the conditions $$\frac{\partial J_l}{\partial \varepsilon} = \frac{\partial J_l}{\partial \varepsilon_M} = \frac{\partial J_r}{\partial \varepsilon} = \frac{\partial J_r}{\partial \varepsilon_M} = 0,$$

since the energy gap $\varepsilon_{01}$ is a function of $J_l$ and $J_r$. Note that this sweet spot does not depend on the tunneling $t_l$ and $t_r$, allowing tunability for $J_l$ and $J_r$ while staying on the sweet spot. Thus, at the sweet spot, $$J_l = \frac{8t_l^2}{\tilde{U}_1 + \tilde{U}'_2} \text{ and } J_r = \frac{8t_r^2}{\tilde{U}_2 + \tilde{U}_3},$$

and single qubit operations can be implemented by simply tuning $t_l$ and $t_r$.

Although Eqns. (5) and (6) above define specific values of $\varepsilon$ and $\varepsilon_M$ at the sweet spot, embodiments of the disclosed subject matter are not limited thereto. Indeed, the detuning parameters may be substantially around the sweet spot, where sensitivity may not be a minimum but still may be sufficiently small so as not to otherwise affect qubit operations. For example, local potentials of two-level systems of each qubit can be controlled such that derivatives of a respective frequency of the qubit with respect to each detuning parameter are within $10^{-3}$ of zero $$\left(\text{i.e., } \frac{\partial E_{01}}{\partial \varepsilon} = \frac{\partial E_{01}}{\partial \varepsilon_M} = \pm 10^{-3}\right),$$

which can yield:

$$\varepsilon = \frac{1}{4}(-\tilde{U}_1 + \tilde{U}'_2 - \tilde{U}_2 + \tilde{U}_3) \pm 0.1 \, U_{av}, \text{ and} \quad (5A)$$

$$\varepsilon_M = \frac{1}{4}(\tilde{U}_1 - \tilde{U}'_2 - \tilde{U}_2 + \tilde{U}_3) \pm 0.1 \, U_{av}, \quad (6A)$$

where $U_{av}$ is the average of value of $\tilde{U}_1$, $\tilde{U}_2$, $\tilde{U}'_2$, and $\tilde{U}_3$ (or, alternatively, the average of $U_1$, $U_2$, $U_3$). In some embodiments, Eqns. (5A) and (6A) (or Eqns. (5) and (6)) may yield respective local potentials (i.e., $\varepsilon_i$) for QDs 1-3 that are within $0.1 \, U_{av}$ of each other.

FIGS. 2A-F show numerical results by exactly solving the Hubbard Hamiltonian, Eqn. (1), also including (210) and (012) configurations. For the simulations, the parameters were set such that $U_1 = U_3 = U = 1$ meV, $U_2 = 0.8$ U, $V_{12} = V_{23} = 0.1$ U, and $V_{13} = 0.05$ U. The Zeeman energy was obtained using GaAs material parameters with $B_{ext} = 0.5$ T, although the teaching herein can apply equally well to silicon QDs or other possible semiconductor systems. Using these parameters, the sweet spot was defined as $\varepsilon = 0$ and $\varepsilon_M$=0.05 U. In addition to the states with $S_{tot}=S_{tot}^z=\frac{1}{2}$ that comprise the subspace, there are two more low-energy states $$|Q\rangle = \frac{|\uparrow_1 \uparrow_2 \downarrow_3\rangle + |\uparrow_1 \downarrow_2 \uparrow_3\rangle + |\downarrow_1 \uparrow_2 \uparrow_3\rangle}{\sqrt{3}} \text{ and}$$

$$|Q_+\rangle = |\uparrow_1 \uparrow_2 \uparrow_3\rangle.$$

But these states do not interact with any states in the subspace and can be neglected.

FIGS. 2A-2F show the energy spectrum and the sweet spot for $t_l=t_r$ (solid curves) corresponding to a rotation around $\hat{z}$ axis, and $$t_l = \frac{(\sqrt{6}+\sqrt{2})t_r}{2}$$

(dashed curves) corresponding to a rotation around $$\hat{n} = -\frac{(\hat{x}+\hat{z})}{\sqrt{2}}$$

axis which, in combination with the Pauli Z gate, can be used to implement Pauli X gate, $X=R_{\hat{n}}(\pi)ZR_{\hat{n}}(\pi)$ where $R_{\hat{n}}(\pi)$ is a $\pi\varepsilon$ rotation around $\hat{n}$ and Z is Pauli Z gate which is a $\pi$ rotation around $\hat{z}$ axis. In particular, FIG. 2A shows the energy spectrum as a function of $\varepsilon$ with fixed $\varepsilon_M$=0.05 U. The energy difference between the two qubit states $|0\rangle_Q$ and $|1\rangle_Q$ shows minimum at the sweet spot $\varepsilon=0$, marked with stars 202 in FIG. 2B and the derivative vanishes at this point as shown in FIG. 2C. As a function of $\varepsilon_M$, the energy spectrum at fixed $\varepsilon=0$ is shown in FIG. 2D, the associated qubit energy is shown in FIG. 2E, and its derivative is shown in FIG. 2F. As is apparent from FIGS. 2D-2F, the sweet spot $\varepsilon_M$=0.05 U does not change for different $t_l$ and $t_r$. The independence of the sweet spot on $t_l$ and $t_r$ allows implementation of a full set of logical gates on the sweet spot.

Figure 3:
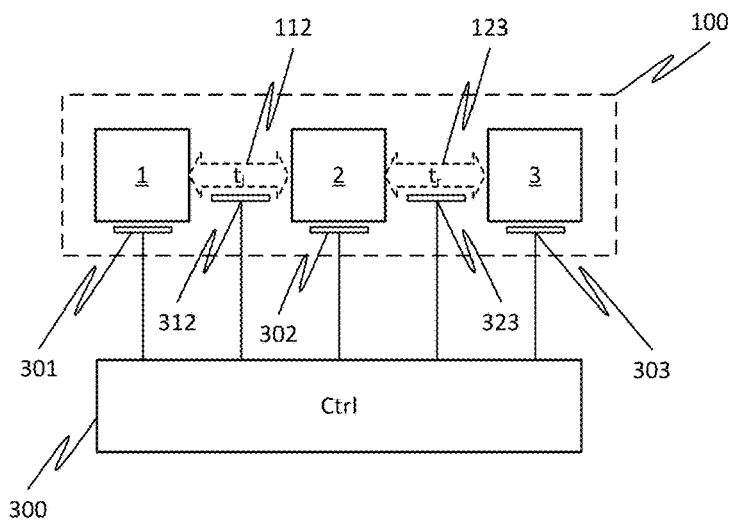
FIG. 3 is a simplified schematic diagram illustrating components of a qubit system for performing single qubit gate operations, according to one or more embodiments of the disclosed subject matter.

Turning to FIG. 3, a system including AEON qubit 100 is shown, which system can be employed in performing a single qubit gate operation. A controller (e.g., circuit) 300 can control AEON qubit 100, including the local potential of each TLS 1-3 and/or the tunnel coupling between each TLS. For example, gate electrodes (e.g., metal electrodes) 301-303 can be provided for each TLS 1-3, and the controller 300 can be configured to control a voltage applied to the gate electrodes 301-303 for adjusting $\varepsilon_1$, $\varepsilon_2$, and $\varepsilon_3$, which in turn controls the detuning parameters $\varepsilon$ and $\varepsilon_M$. In embodiments, $\varepsilon_1$, $\varepsilon_2$, and $\varepsilon_3$ made controlled by controller 300 to be within an order of magnitude of each other, for example, to be within 0.1 $U_{av}$ of each other.

For example, gate electrodes (e.g., metal electrodes) 312 and 323 can also be provided for each tunnel coupling 112, 123, and the controller 300 can be configured to control a voltage applied thereto for performing a gate operation, without affecting the qubit's location on the sweet spot. The controller 300 may maintain each of the tunnel couplings 112, 123 in an on-state during the entirety of the single qubit gate operation, thereby enabling the exchange between adjacent QDs 1-3, but tuning of the tunnel coupling can be effective to perform gate operations, as described above. In embodiments, the controller 300 can be configured to perform the single qubit gate operation by applying no more than three electrical (e.g., DC) pulses to the AEON qubit 100, for example, by applying relatively fast simultaneous (or substantially simultaneous) pair-wise pulses to tunnel coupling gate electrodes 112, 123.

Figure 4:
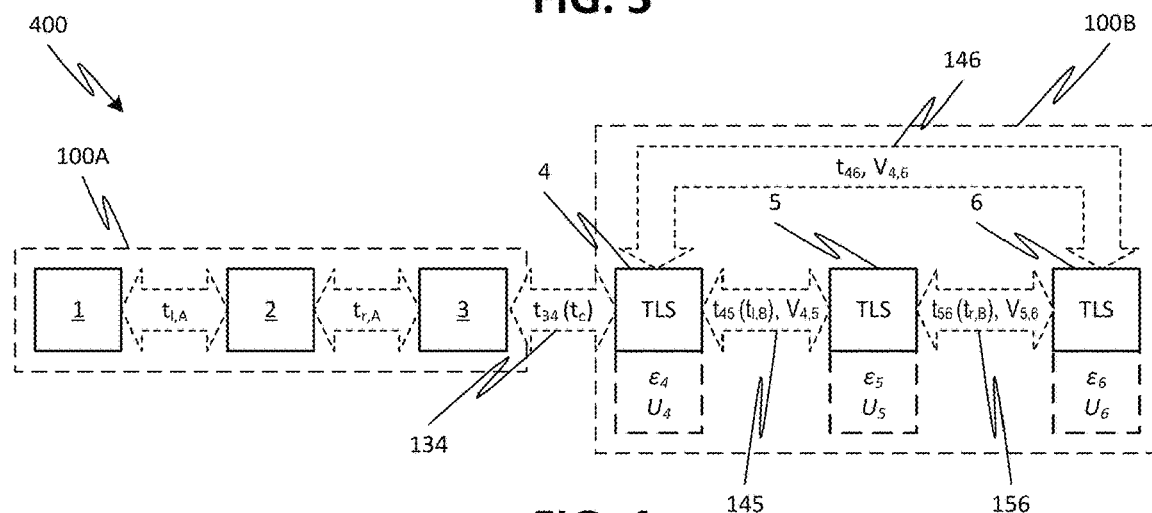
FIG. 4 is a simplified schematic diagram illustrating two-level systems of and variables associated with a pair of three-spin qubits, according to one or more embodiments of the disclosed subject matter.

Referring to FIG. 4, an exemplary system for performing two-qubit gate operations using multiple AEON qubits 100A, 100B is shown. The first AEON qubit 100A can include a first TLS 1, a second TLS 2, and a third TLS 3, as in the configuration of FIG. 1A. The second AEON qubit 100B can include a fourth TLS 4, a fifth TLS 5, and a sixth TLS 6, similar to the configuration of FIG. 1A. Although shown as a linear array, the TLSs of the qubits 100A and 100B can be arranged along non-linear geometries, for example, in a V- or U-shape, and each TLS 1-6 can be, for example, a QD, such as a semiconductor QD. Each TLS i (where i=1-6) can have a respective local potential (e.g., dot energy) $\varepsilon_i$ and a respective on-site Coulomb interaction energy $U_i$, and can have coupling between each other ij (where i,j=1-6) defined by tunnel coupling $t_{ij}$ and cross Coulomb interaction energy $V_{ij}$, some of which are illustrated in FIG. 4.

The sweet spot of each encoded qubit 100A, 100B changes due to the inter-qubit Coulomb interactions, but still all gate operations can be done on a sweet spot. The qubit-qubit interaction is implemented using the exchange coupling 134 ($t_c$) between neighboring QDs (e.g., QD 3 and QD 4) belonging to different encoded qubits, which can also be made to be insensitive to charge noise up to first order by tuning the respective qubit energies.

Two-qubit gates between exchange-only qubits can be implemented in a long sequence of pair-wise exchange interaction pulses, if the pulses are applied in a serial mode. Keeping the intra-qubit exchange interactions (e.g., $t_{l,A}$, $t_{r,A}$, $t_{l,B}$, $t_{r,B}$) always-on allows for a much shorter sequence. The procedure described above allows individual control of the intra-qubit exchange interactions while staying on a sweet spot. But the inter-qubit exchange interaction (e.g., $t_c$) can also be insensitive to the charge noise up to first order.

Considering the array of exchange-only qubits 100A, 100B of FIG. 4, the position of the sweet spot in the parameter space (E, $\varepsilon_M$) shifts based on the redefinition of the Coulomb interaction change $U_i$ due to double occupancy to take into account the presence of additional electron spins in different qubits. For example, $$\tilde{U}_1 = U_1 - V_{12} - V_{23} + V_{13} + V_{\Sigma,1} - V_{\Sigma,2} \tag{7A}$$

$$\tilde{U}_2 = U_2 + V_{12} - V_{23} - V_{13} + V_{\Sigma,2} - V_{\Sigma,3} \tag{7B}$$

$$\tilde{U}'_2 = U_2 - V_{12} + V_{23} - V_{13} + V_{\Sigma,2} - V_{\Sigma,1} \tag{7C}$$

$$\tilde{U}_3 = U_3 - V_{12} - V_{23} + V_{13} + V_{\Sigma,3} - V_{\Sigma,2}, \tag{7D}$$

where $V_{\Sigma,i}$ is the sum of $V_{ij}$ for all QDs j belonging to a different qubit (e.g., $V_{\Sigma,1} = V_{13} + V_{15} + V_{16} + \ldots$). The sweet spot condition in Eqns. (5), (6), (5A), and (6A) otherwise remain the same with the above adjusted $U_i$'s.

The inter-qubit exchange coupling $J_c$ between QDs 3 and 4 is given by:

$$J_c = 2t_c^2 \left[ \frac{1}{\overline{U}_3 + \varepsilon_3 - \varepsilon_4} + \frac{1}{\overline{U}_4 + \varepsilon_3 - \varepsilon_4} \right] \quad (8)$$

$$\overline{U}_3 = U_3 + V_{13} + V_{23} - V_{34} - V_{45} - V_{46} + V_{\Sigma,3} - V_{\Sigma,4} \quad (8A)$$

$$\overline{U}_4 = U_4 + V_{45} + V_{46} - V_{13} - V_{23} - V_{34} + V_{\Sigma,4} - V_{\Sigma,3} \quad (8B)$$

To find the sweet spot for $J_c$, from $$\frac{\partial J_c}{\partial \varepsilon_3} = \frac{\partial J_c}{\partial \varepsilon_4} = 0,$$

we obtain $$\varepsilon_3 - \varepsilon_4 = -\frac{\overline{U}_3 - \overline{U}_4}{2}.$$

This can be satisfied by tuning $\bar{\varepsilon}^{(A)}$ and $\bar{\varepsilon}^{(B)}$, and $\varepsilon^{(A)}$, $\varepsilon_M^{(A)}$, $\varepsilon^{(B)}$, $\varepsilon_M^{(B)}$ remain at the sweet spots for qubits 100A and 100B. Similar to the intra-qubit exchange interactions, $J_c$ is controlled by tuning the tunneling $t_c$ which does not affect the sweet spot.

In the weak coupling regime where $J_c \ll J^{(A)}, J^{(B)}$, this exchange coupling leads to a coupling Hamiltonian:

$$\hat{H}_c = \frac{\delta J_z(\sigma_{zA} + \sigma_{zB})}{2} + J_{zz}\sigma_{zA}\sigma_{zB} + J_\perp(\sigma_{xA}\sigma_{xB} + \sigma_{yA}\sigma_{yB}) \quad (9)$$

where $\sigma_{\alpha A}$ and $\sigma_{\alpha B}$ ($\alpha = x, y, z$) are the Pauli operators for qubits A and B, respectively. The coupling coefficients $\delta J_z$, $J_{zz}$, and $J_\perp$ are all proportional to the exchange coupling $J_c$. For the linear geometry in FIG. 4, $$\frac{\delta J_z}{J_c} = \frac{J_{zz}}{J_c} = \frac{1}{36}, \frac{J_\perp}{J_c} = -\frac{1}{24}, \text{ for } J^{(A)} \simeq J^{(B)}$$

and 0 for $|J^{(A)} - J^{(B)}| \gg J_c$.

Figure 5:
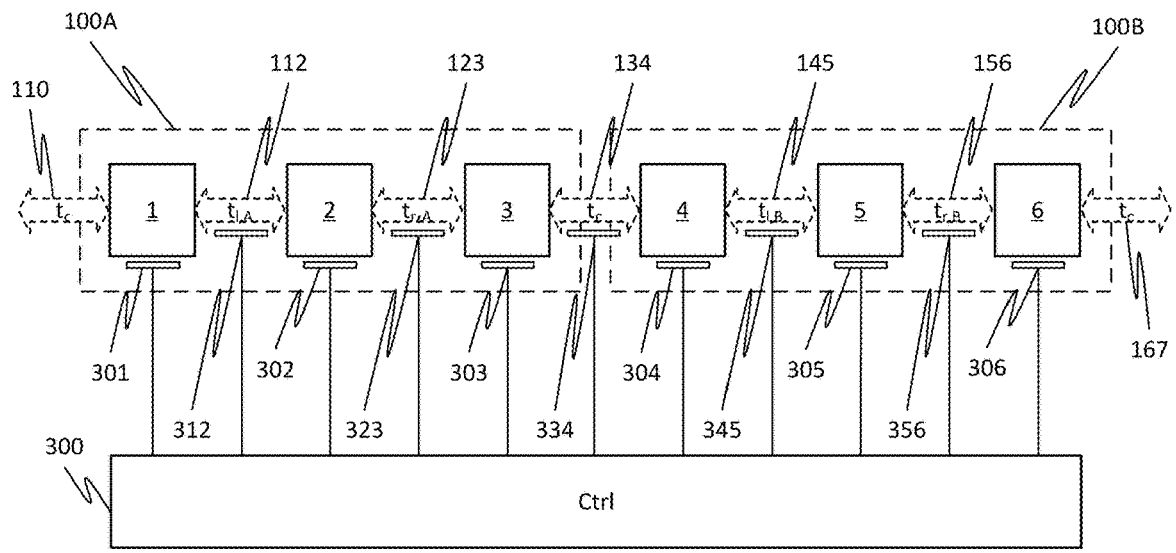
FIG. 5 is a simplified schematic diagram illustrating components of a qubit system for performing two-qubit gate operations, according to one or more embodiments of the disclosed subject matter.

Turning to FIG. 5, a system including AEON qubit 100A and AEON qubit 100B is shown, which system can be employed in performing a two-qubit gate operation. A controller (e.g., circuit) 300 can control both qubits 100A, 100B, including the local potential of each QD 1-6 and/or the tunnel coupling between each QD. For example, gate electrodes (e.g., metal electrodes) 301-306 can be provided for each TLS 1-6, and the controller 300 can be configured to control a voltage applied to the gate electrodes 301-306 for adjusting $\varepsilon_1, \varepsilon_2, \varepsilon_3, \varepsilon_4, \varepsilon_5,$ and $\varepsilon_6$, which in turn controls the detuning parameters $\varepsilon^{(A)}$, $\varepsilon_M^{(A)}$, $\varepsilon^{(B)}$, and $\varepsilon_M^{(B)}$. In embodiments, $\varepsilon_1, \varepsilon_2,$ and $\varepsilon_3$ may be controlled by controller 300 to be within an order of magnitude of each other, for example, to be within 0.1 $U_{av}^{(A)}$ of each other, and $\varepsilon_4, \varepsilon_5,$ and $\varepsilon_6$ may be separately controlled by controller 300 to be within an order of magnitude of each other, for example, to be within 0.1 $U_{av}^{(B)}$ of each other.

For example, gate electrodes (e.g., metal electrodes) 312, 323, 345, and 356 can also be provided for each tunnel coupling 112, 123, 145, and 156. The controller 300 can be configured to maintain each tunnel coupling 112, 123, 145, 156 (e.g., the intra-qubit coupling) in an on stage during performance of the gate operation, without affecting the qubit's location on the sweet spot. In addition, a gate electrode (e.g., metal electrode) 334 can be provided for inter-qubit tunnel coupling 134. In embodiments, the controller 300 can be configured to perform the two qubit gate operation by applying a single exchange pulse, e.g., an electrical (e.g., DC) pulse to the gate electrode 334 controlling tunnel coupling 134 between QD 3 of the first qubit 100A and QD4 of the second qubit 100B.

Figure 6A:
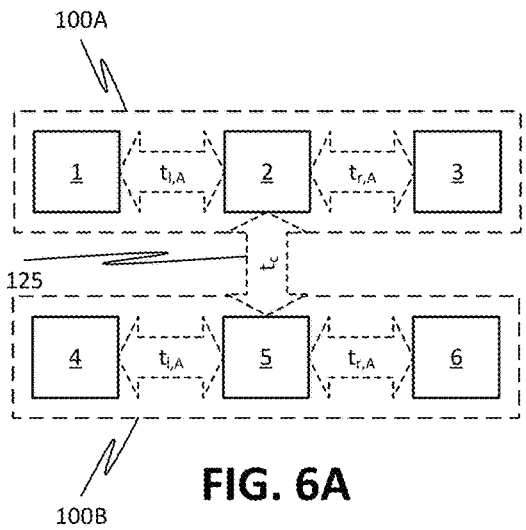
FIG. 6A illustrates an alternative configuration for components of a qubit system for performing two-qubit gate operations, according to one or more embodiments of the disclosed subject matter.
Figure 6B:
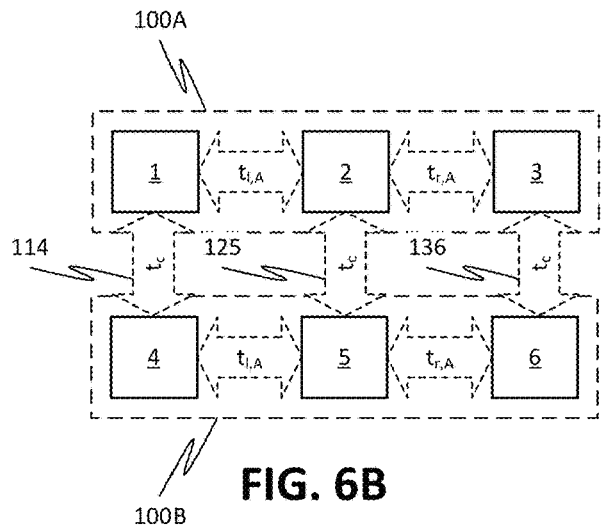
FIG. 6B illustrates another alternative configuration for components of a qubit system for performing two-qubit gate operations, according to one or more embodiments of the disclosed subject matter.

Although FIGS. 4-5 illustrate a linear arrangement of QDs 1-6 and qubits 100A, 100B, with inter-qubit coupling between adjacent QDs at respective ends of the linear arrangement, embodiments of the disclosed subject matter are not limited thereto. For example, as shown in FIGS. 6A-6B, the qubits 100A, 100B may be arranged in parallel rather than serially arranged. Moreover, inter-qubit coupling may be achieved between a single pair of adjacent QDs, for example, QD 2 and QD 5, as shown in FIG. 6A, or between each adjacent pair of QDs, for example, as shown in FIG. 6B. Other configurations and inter-qubit coupling arrangements are also possible according to one or more contemplated embodiments.

Moreover, even though only two qubits 100A, 100B are illustrated in FIGS. 4-6B, systems with more than two qubits are contemplated. For example, qubit 100A may be coupled to an adjacent qubit via independently controllable coupling 110 (controlled by controller 300 via a gate electrode (not shown)) and qubit 100B may be coupled to an adjacent qubit via independently controllable coupling 167 (controlled by controller 300 via another gate electrode (not shown)). Indeed, physically realizable systems are anticipated to include many more than two qubits, for example, on the order of at least hundreds, thousands, or millions. The other qubits may be similar to qubits 100A, 100B, and may be arranged and coupled to each other similar to that illustrated for qubits 100A, 100B, as will be readily apparent to one of ordinary skill in the art.

Moreover, although the discussion herein classifies QDs 1-3 as being part of qubit 100A, this classification is not static and may be configured on the fly by controller 300 or another system. For example, qubit 100A may be defined by appropriate control of tunnel couplings 110, 112, 123, 134, 145, 156, and 167 and respective local potentials to select a particular adjacent trio of QDs 1-6, such as QDs 2-4 instead of QDs 1-3. In such a configuration, tunnel coupling 112 would then constitute an inter-qubit coupling rather than an intra-qubit coupling. When QDs are arrayed in a two-dimensional array, linear triplets of the QDs may be selected for a particular AEON by control of the tunnel coupling and local potentials, whereas coupling between vertical rows (or horizontal columns, depending on the configuration), which may otherwise be undesirable during a gate operation, may be turned off by control of the inter-qubit coupling.

As noted above, the configuration of FIGS. 4-5 (or alternatively, 6A-6B) can be used to perform a two-qubit gate operation. In a CPHASE gate implementation, it is simpler for $$\frac{J_\perp}{J_c} = 0, \text{ i.e., } |J^{(A)} - J^{(B)}| \gg J_c.$$

For typical exchange coupling strength of hundreds of MHz for $$\frac{J^{(A)}}{h} \text{ and } \frac{J^{(B)}}{h},$$

for example, $$\frac{J^{(A)}}{h} = 100 \text{ MHz and } \frac{J^{(B)}}{h} = 300 \text{ MHz},$$

a value for $J_c \approx 10$ MHz can be used. The CZ gate can be obtained for $\int J_{zz}(t)dt = \pi/4$, which corresponds to a gate operation time of a few hundred ns for a square pulse. This may be considered slow as compared to the typical single exchange pulse of a few ns; however, it is due to the requirement of small $J_c$ to prevent leakage errors. Different geometries for qubit-qubit coupling may help to reduce the operation time. For example, spins in QDs 2 and 3 are swapped and also spins in QDs 4 and 5 are swapped, the inter-qubit exchange coupling may be equivalent to the "butterfly" geometry illustrated in FIG. 6A. As a result, a two-qubit CZ gate may be performed in about 20 ns.

Figure 7:
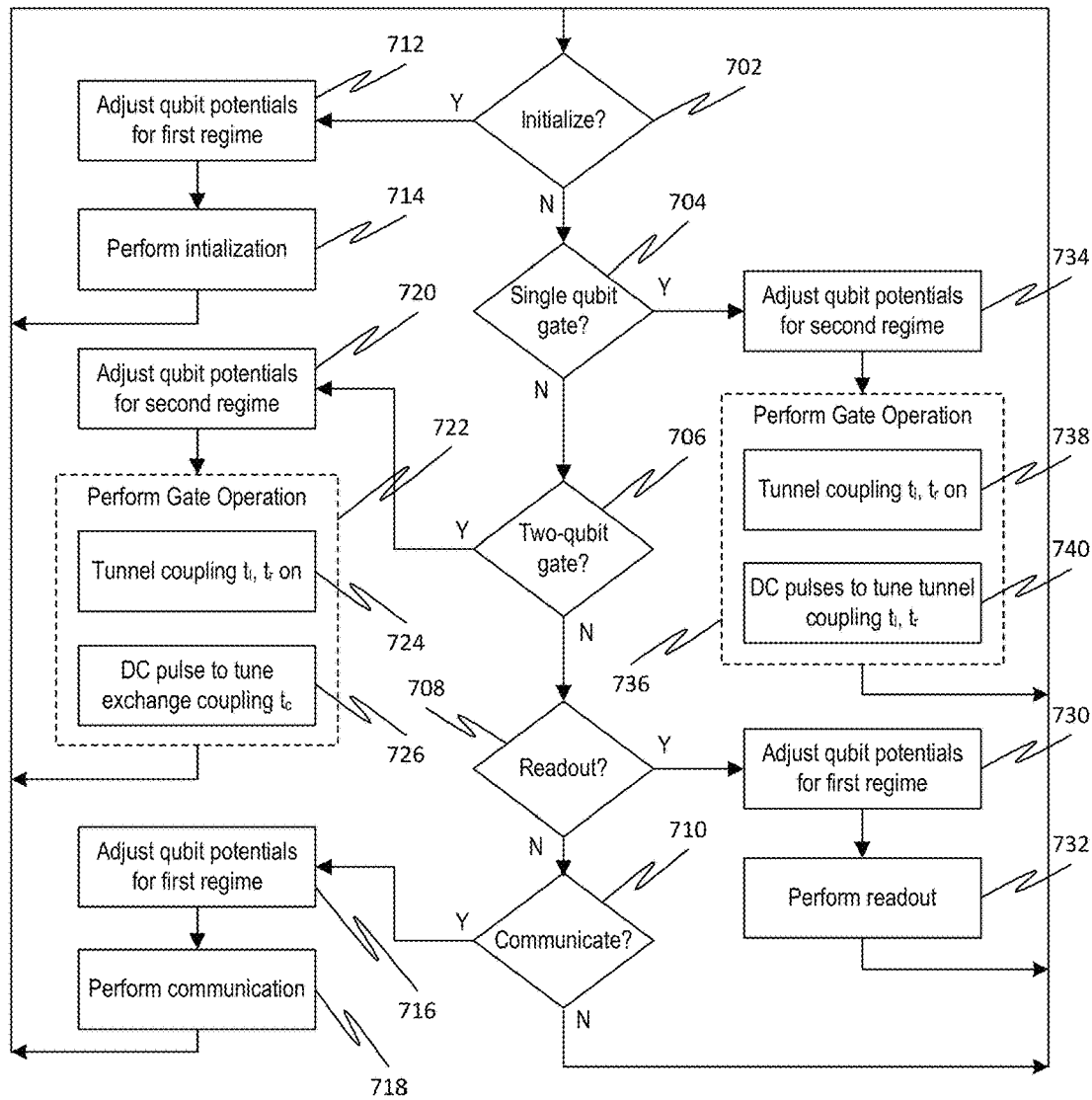
FIG. 7 is a process flow diagram for aspects of qubit control method for single or two-qubit gate operations, according to one or more embodiments of the disclosed subject matter.

Referring to FIG. 7, a generalized process for operating one or more qubits of a quantum system is illustrated. For example, the process can determine at 702 whether initialization of a particular qubit (or pair of qubits in a two-qubit gate operation) is desired. If initialization is desired, the process can proceed to 714, where the qubit (or qubits) is adjusted to be within a first regime.

When operating at the sweet spot, increasing ε leads to (012) ground state, not (102) ground state as in RX regime. The two almost vertical lines in FIG. 2A correspond to states with (012) and (210) configurations. This can be a problem for initialization or readout, since (012) is not coupled to (111) by a single tunneling event and the anti-crossing between them is very small. In other words, a relatively long time is needed to move from (012) to (111), which can be beneficial for turning off any dipole-like coupling to external noise or quantum systems.

To avoid this issue, initialization/readout for an AEON qubit can be performed in the first regime and then converted to the second regime (i.e., sweet spot) thereafter, for example, by tuning $\varepsilon_M$. For example, the QDs comprising the AEON qubit can be individually tuned by the attached metallic gates to move the device between the first and second regimes. The first regime may be when the local potentials of the QDs of the qubit are outside of the above noted sweet spot (i.e., a second regime satisfying Eqns. (5) and (6), or Eqns. (5A) and (6A)). Thus, in the second regime, the local potentials may be within 0.1 $U_{av}$ (i.e., $\varepsilon_1 \approx \varepsilon_2 \approx \varepsilon_3$), and, in the first regime, one of the local potentials may be substantially larger than another of the local potentials (i.e., greater than 0.1 $U_{av}$, for example, $\varepsilon_2 \gg \varepsilon_1 \approx \varepsilon_3$). Alternatively or additionally, the first regime may be similar to operation of a traditional 3-DFS exchange only qubit or the RX qubit.

After adjusting to be in the first regime, the process proceeds to initialization at 714. For example, the device can be tuned in the (102) charge configuration by changing the gate voltages. The device can be cooled to reach this ground state of (102) configuration, which has spin singlet states in QD 3 due to the Pauli exclusion principle and large Coulomb interaction energy. The gate voltages are then slowly changed to move the qubit onto the sweet spot in the (111) charge configuration regime, maintaining the single state between spins in QD 2 and QD 3. By performing a swap operation between spins in QD 1 and QD 2 (while maintaining the sweet spot), the encoded |0⟩ state can be achieved. The process can then return to repeat at 702.

If initialization is not desired, the process can proceed to 704, where it is determined whether a single qubit gate operation is desired. If single qubit gate operation is desired, the process can proceed to 734, where the qubit is adjusted to be within the second regime, e.g., by adjusting the QD local potentials $\varepsilon_i$ to be at or near the sweet spot. The process then proceeds to 736 where the single qubit gate operation is performed, in particular by maintaining intra-qubit tunnel couplings $t_l$ and $t_r$ in an on state at 738 and while applying simultaneous electric pulses (e.g., DC pulses) to tune the tunnel couplings $t_l$ and $t_r$ at 740. When operating in parallel mode (i.e., when tunnel couplings $t_l$ and $t_r$ are tuned at the same time, the single qubit gate operation may be performed by applying no more than three electrical pulses to the qubit in 736. When operating in serial mode (i.e., when tunnel couplings $t_l$ and $t_r$ are tuned sequentially), the single qubit gate operation may be performed by applying no more than four electrical pulses to qubit in 736. The process can then return to repeat at 702.

If single qubit gate operation is not desired, the process can proceed to 706, where it is determined whether a two-qubit operation is desired. If two-qubit operation is desired, the process can proceed to 720, where each qubit is independently adjusted to be within its respective second regime, e.g., by adjusting the QD local potentials $\varepsilon_1$ through $\varepsilon_3$ for the first qubit to be at or near its sweet spot and adjusting the QD local potentials $\varepsilon_4$ through $\varepsilon_6$ for the second qubit to be at or near its sweet spot, which may be different than that of the first qubit.

The process then proceeds to 722 where the two-qubit gate operation is performed, in particular by maintaining intra-qubit tunnel couplings (i.e., $t_l^{(A)}$, $t_r^{(A)}$, $t_l^{(B)}$, $t_r^{(B)}$) in an on state at 724 and while applying an electric pulse (e.g., DC pulse) to tune the exchange coupling $t_c$ between qubits at 726. For example, the two-gate operation may be performed by applying a single electrical pulse to exchange coupling between qubits in 722. Thus, during the entangling two-qubit operation, the tunnel couplings between spins in a same qubit are maintained so that the qubit is on the sweet spot. Only the inter-qubit tunnel coupling $t_c$ is tuned by electric pulses. The process can then return to repeat at 702. For example, to implement any two qubit gate operations, single qubit operations (e.g., 736) may be performed on each qubit before and/or after the entangling two-qubit gate operation.

If two-qubit gate operation is not desired, the process can proceed to 708, where it is determined if readout of a particular qubit is desired. If readout is desired, the process can proceed to 716, where the qubit (or qubits) is adjusted to be within the first regime. As with initialization, the qubit can be tuned in the (102) charge configuration by changing the gate voltages, but read-out can be performed in a reverse order as the initialization, e.g., moving from the second regime to the first regime at 730 and then performing the readout operation 732. For example, a swap operation can be applied between ns in QD 1 and QD 2 of the AEON qubit. The gate voltages can then be changed to move the system into the (102) charge configuration. Depending on the spin states of the two spins in QD 2 and QD 3, the double occupancy in QD 3 may or may not be realized. The presence (or lack) of double occupancy in QD 3 can be measured by a nearby charge measuring device, such as a quantum point contact transport measurement setup. Alternatively or additionally, for readout, the qubit can be tuned into the first regime, but similar to an RX qubit (i.e., by increasing the local potential (i.e., quantum dot energy level) of QD2). The AEON qubit now in the first regime may exhibit a dipole moment that can be coupled to a resonator for beyond-nearest neighbor quantum gates in order to perform readout. Note that, in some embodiments, tuning from the second regime to the first regime may include adjusting the tunnel couplings as well as the local potentials, since operation in the first regime (e.g., RX qubit operating at its partial sweet spot) may be dependent on tunnel coupling between adjacent QDs. The process can then return to repeat at 702.

If readout is not desired, the process can proceed to 710, where it is determined if communication with another qubit is desired. If communication is desired, the process can proceed to 716, where both qubits are adjusted to be within the first regime. For example, each qubit can be tuned into the first regime, but similar to RX qubits (i.e., by increasing the quantum dot energy level of QD2). Each qubit now in the first regime may exhibit a dipole moment that can be used to communicate with each other, for example, by direct dipole-dipole interactions between the two first regime qubits, or by dipole-coupling to a common resonator. The process can then return to repeat at 702. If communication is not desired at 710, the process can also return to repeat at 702.

be maintained but without active tuning of the tunnel couplings. Instead, the device relies on natural tunneling between the QDs. Such an idle configuration may take the form of a single qubit gate (e.g., if $J_l=J_r$, then a sigma-Z operation or a phase gate) were no operation is performed, at least for some time t.

Based on the teachings herein, one of ordinary skill in the art would readily understand how to effect other single and two qubit gate operations beyond those specifically discussed herein, such as, but not limited to, Hadamard gate, Pauli-X gate, Pauli-Y gate, Pauli-Z gate, Square-root-of-NOT gate, phase shift gates, Swap gates, Square-root-of-Swap gates, and Controlled gates.

In embodiments, operation (whether gate or idle) of the 3-spin qubit (e.g., AEON) is where the tunnel couplings between the 3-spins are non-zero and tuned such that the energy of the 3-spin qubit does not change (or only minimally changes, as described elsewhere herein) for small shifts in the energies (e.g., due to charge noise) of the three QDs individually. Operations can be accomplished by pair-wise exchange pulses (i.e., pulses to tune tunnel couplings between each pair of QDs) while maintaining non-zero tunneling couplings, and while maintaining the qubit at the sweet spot to protect it from noise on the energy parameters.

As discussed herein, embodiments provide an AEON qubit capable of performing gate operations while operating on a sweet spot. While the RX qubit discussed above is capable of operating on a partial sweet spot, the sweet spot suggested by Eqns. (5) and (6) (or Eqns. (5A) and (6A)) for the AEON qubit is more general. In particular, the AEON qubit does not require any symmetries in parameters, and it does not depend on changing $t_l$ and $t_r$, thereby allowing for full logical gate operations on the sweet spot by simply tuning the tunnel coupling between QDs, i.e., all-DC control. Moreover, it is in a deep (111) regime where $\varepsilon_i$'S of the QDs of the AEON qubit are of similar values as compared to the Coulomb interaction energy $U_i$'s, e.g., within 0.1 $U_{av}$ of each other. Further comparisons between prior exchange qubits and the AEON qubit are provided in Table 1 below.

TABLE 1

Comparison of disclosed qubit with other exchange-only qubits

| Qubit Type | 3-DFS Exchange Only | Resonant Exchange | AEON Qubit |
|---|---|---|---|
| QD levels | General | $\varepsilon_2 \gg \varepsilon_1 \simeq \varepsilon_3$ | $\varepsilon_1 \simeq \varepsilon_2 \simeq \varepsilon_3$ |
| Coherence protection | DFS | DFS, partial sweet spot | DFS, full sweet spot |
| Idle/memory | All exchange couplings off | Always on coupling $f_Q \sim 0.5$-2 GHz | All exchange couplings off or always-on |
| Single qubit gates | 4 fast pair-wise pulses | RF pulse | 3 fast simultaneous pair-wise pulses |
| Two-qubit gates | 18 fast pair-wise pulses | Dipole-dipole interaction or single exchange pulse | Single exchange pulse |

Note that embodiments of the disclosed subject matter are not limited to the specific steps and order thereof illustrated in FIG. 7. Indeed, the steps may be rearranged (e.g., readout inquiry 704 occurring after gate inquiries 708, 710) or omitted (e.g., initialization 702 omitted after initial qubit setup) and/or other non-illustrated steps can be added, according to one or more contemplated embodiments.

Moreover, other steps besides those specifically illustrated in FIG. 7 are also possible. For example, the AEON qubit can be maintained in an idle state, e.g., a triple QD device with both tunnel couplings on and deep in the (111) reamer, where energies of the QDs are substantially equal (i.e., within 0.1 $U_{av}$ of each other). The sweet spot can thus Another advantage of the sweet spot operations disclosed herein is that it allows for a true off-state for the encoded qubit by turning off the exchange interactions (transforming the qubit into the traditional 3-DFS qubit), while remaining on the sweet spot. This can simplify gate operations and can be useful, for example, for storing quantum information. For example, in some embodiments, the qubit can be configured as a quantum storage device (i.e., memory) where the inter-qubit and intra-qubit tunneling are tuned to maintain information within the qubit while both detuning parameters (e.g., $\varepsilon$ and $\varepsilon_M$) are otherwise maintained at (or near) the sweet spot.

While the qubit states have been defined above as the singlet/triplet states between QDs 1 and 3, the sweet spot defined in Eqs. (5) and (6) (or Eqs. (5A) and (6A)) can also be a sweet spot for an qubit defined as the singlet/triplet states of QDs 1 and 2. Thus, all exchange operations can also be realized on the sweet spot by tuning the tunneling $t_l$ and $t_r$. Simultaneous exchange operations ("always-on") can reduce the length of the sequence of exchange operations required for two-qubit gates. Sometimes it is beneficial to work on one or the other definition for the qubit states, and they can be easily converted to and from each other by applying a swap operation between QDs 2 and 3 which can be implemented by tuning $J_l=0$ and $J_r \neq 0$.

As disclosed herein, multiple exchange interaction gates can be simultaneously applied while remaining on the sweet spot in exchange-only qubits. However, the teachings of the present disclosure are not limited to the specific QD configurations disclosed herein. Indeed, the teachings of the present disclosure are also applicable in coupling different types of QD spin encoded qubits since the exchange interaction enables coupling between them. Moreover, although the above-described embodiments have been directed to qubits employing QDs formed in a semiconductor (e.g., GaAs or Si), embodiments of the disclosed subject matter are not limited thereto. Indeed, the teachings herein can be applicable to a wide variety of spin qubit systems, such as, but not limited to, impurity spins, which offer tunable detuning and tunnel barriers.

It will be appreciated that the aspects of the disclosed subject matter can be implemented, fully or partially, in hardware, hardware programmed by software, software instruction stored on a computer readable medium (e.g., a nontransitory computer readable medium) or a combination of the above.

For example, components of the disclosed subject matter, including components such as a controller, processor, or any other feature, can include, but are not limited to, a personal computer or workstation or other such computing system that includes a processor, microprocessor, microcontroller device, or is comprised of control logic including integrated circuits such as, for example, an application specific integrated circuit (ASIC).

Features discussed herein can be performed on a single or distributed processor (single and/or multi-core), by components distributed across multiple computers or systems, or by components co-located in a single processor or system. For example, aspects of the disclosed subject matter can be implemented via a programmed general purpose computer, an integrated circuit device (e.g., ASIC), a digital signal processor (DSP), an electronic device programmed with microcode (e.g., a microprocessor or microcontroller), a hard-wired electronic or logic circuit, a programmable logic circuit (e.g., programmable logic device (PLD), programmable logic array (PLA), field-programmable gate array (FPGA), programmable array logic (PAL)), software stored on a computer-readable medium or signal, an optical computing device, a networked system of electronic and/or optical devices, a special purpose computing device, a semiconductor or superconductor chip, a quantum computing chip or device, a software module or object stored on a computer-readable medium or signal.

When implemented in software, functions may be stored on or transmitted over as one or more instructions or code on a computer-readable medium. The steps of a method or algorithm disclosed herein may be embodied in a processor-executable software module, which may reside on a computer-readable medium. Instructions can be compiled from source code instructions provided in accordance with a programming language. The sequence of programmed instructions and data associated therewith can be stored in a computer-readable medium (e.g., a nontransitory computer readable medium), such as a computer memory or storage device, which can be any suitable memory apparatus, such as, but not limited to quantum-based memory, read-only memory (ROM), programmable read-only memory (PROM), electrically erasable programmable read-only memory (EEPROM), random-access memory (RAM), flash memory, disk drive, etc.

As used herein, computer-readable media includes both computer storage media and communication media, including any medium that facilitates transfer of a computer program from one place to another. Thus, a storage media may be any available media that may be accessed by a computer. By way of example, and not limitation, such computer-readable media may comprise RAM, ROM, EEPROM, CD-ROM or other optical disk storage, magnetic disk storage or other magnetic storage devices, quantum-based storage, or any other medium that may be used to carry or store desired program code in the form of instructions or data structures and that may be accessed by a computer.

Also, any connection is properly termed a computer-readable medium. For example, if the software is transmitted from a website, server, or other remote source using a transmission medium (e.g., coaxial cable, fiber optic cable, twisted pair, digital subscriber line (DSL), or wireless technologies such as infrared, radio, and microwave), then the transmission medium is included in the definition of computer-readable medium. Moreover, the operations of a method or algorithm may reside as one of (or any combination of) or a set of codes and/or instructions on a machine readable medium and/or computer-readable medium, which may be incorporated into a computer program product.

One of ordinary skill in the art will readily appreciate that the above description is not exhaustive, and that aspects of the disclosed subject matter may be implemented other than as specifically disclosed above. Indeed, embodiments of the disclosed subject matter can be implemented in hardware and/or software using any known or later developed systems, structures, devices, and/or software by those of ordinary skill in the applicable art from the functional description provided herein.

In this application, unless specifically stated otherwise, the use of the singular includes the plural, and the separate use of "or" and "and" includes the other, i.e., "and/or." Furthermore, use of the terms "including" or "having," as well as other forms such as "includes," "included," "has," or "had," are intended to have the same effect as "comprising" and thus should not be understood as limiting.

Any range described herein will be understood to include the endpoints and all values between the endpoints. Whenever "substantially," "approximately," "essentially," "near," or similar language is used in combination with a specific value, variations up to and including 10% of that value are intended, unless explicitly stated otherwise.

It is thus apparent that there is provided in accordance with the present disclosure, systems, methods, and devices for noise-insensitive qubit gate operations. Many alternatives, modifications, and variations are enabled by the present disclosure. While specific examples have been shown and described in detail to illustrate the application of the principles of the present invention, it will be understood that the invention may be embodied otherwise without departing from such principles. For example, disclosed features may be combined, rearranged, omitted, etc. to produce additional embodiments, while certain disclosed features may sometimes be used to advantage without a corresponding use of other features. Accordingly, Applicant intends to embrace all such alternatives, modifications, equivalents, and variations that are within the spirit and scope of the present invention.

The invention claimed is:

1. A method comprising:
performing a single qubit gate operation on a three-spin qubit or a two-qubit gate operation on adjacent three-spin qubits,
wherein each qubit has first through third two-level systems having respective local potentials $\varepsilon_1$ through $\varepsilon_3$,
wherein each qubit is characterized by a pair of non-trivial detuning parameters representing energy differences between respective energy levels of the two-level systems of the qubit,
wherein the detuning parameters are $$\varepsilon = \frac{\varepsilon_1 - \varepsilon_3}{2} \text{ and } \varepsilon_M = \varepsilon_2 - \frac{\varepsilon_1 + \varepsilon_3}{2},$$

wherein the second two-level system is adjacent to both the first and third two-level systems,
wherein in performing the single qubit gate operation or the two-qubit gate operation:
local potentials of the two-level systems of each qubit are controlled such that:

$\varepsilon = \frac{1}{4}(-\tilde{U}_1 + \tilde{U}'_2 - \tilde{U}_2 + \tilde{U}_3) \pm 0.1\ U_{av}$, $\varepsilon_M = \frac{1}{4}(\tilde{U}_1 - \tilde{U}'_2 - \tilde{U}_2 + \tilde{U}_3) \pm 0.1\ U_{av}$, and derivatives of a respective frequency of the qubit with respect to each detuning parameter are within $10^{-3}$ of zero, and
tunnel couplings between adjacent two-level systems of each qubit are controlled to be non-zero,
wherein $\tilde{U}_i$ represents a change in Coulomb interaction energy when an i-th two-level system is doubly occupied by tunneling of an electron from an adjacent two-level system,
wherein $U_{av}$ is the average of value of $\tilde{U}_1, \tilde{U}_2, \tilde{U}'_2,$ and $\tilde{U}_3$,
wherein $\tilde{U}'_2$ corresponds to when the second two-level system is doubly occupied by tunneling of an electron from the first two-level system, and
wherein $\tilde{U}_2$ corresponds to when the second two-level system is doubly occupied by tunneling of an electron from the third two-level system.

2. The method of claim 1, wherein, during the single qubit gate operation or the two-qubit gate operation, for each qubit, the respective local potentials of the two-level systems therein are controlled to be within $0.1\ U_{av}$ of each other.

3. The method of claim 2, further comprising:
performing a readout or initialization operation on the three-spin qubit or the adjacent three-spin qubits,
wherein during the readout or initialization operation, for at least one of the qubits, the local potential of at least one of the two-level systems differs from the location potential of another of the two-level system by more than $0.1\ U_{av}$.

4. The method of claim 1, wherein said performing includes applying pairwise exchange pulses to the qubit or qubits while maintaining the tunnel couplings to be nonzero.

5. A system comprising:
a three-spin qubit with first through third two-level systems having respective local potentials 249$_1$ through $\varepsilon_3$; and a controller comprising circuitry programmed to control the qubit in performing a single qubit gate operation or a two-qubit gate operation,
wherein the qubit is characterized by a pair of non-trivial detuning parameters representing energy differences between respective energy levels of the two-level systems of the qubit,
wherein the detuning parameters are $$\varepsilon = \frac{\varepsilon_1 - \varepsilon_3}{2} \text{ and } \varepsilon_M = \varepsilon_2 - \frac{\varepsilon_1 + \varepsilon_3}{2},$$

wherein the second two-level system is adjacent to both the first and third two-level systems, and
wherein, in performing the single qubit gate operation or the two-qubit gate operation, the circuitry of the controller is programmed to control:
local potentials of the two-level systems of the qubit such that:

$\varepsilon = \frac{1}{4}(-\tilde{U}_1 + \tilde{U}'_2 - \tilde{U}_2 + \tilde{U}_3) \pm 0.1\ U_{av}$, $\varepsilon_M = \frac{1}{4}(\tilde{U}_1 - \tilde{U}'_2 - \tilde{U}_2 + \tilde{U}_3) \pm 0.1\ U_{av}$, and derivatives of a respective frequency of the qubit with respect to each detuning parameter are within $10^{-3}$ of zero, and
tunnel couplings between adjacent two-level systems of each qubit to be non-zero,
wherein $\tilde{U}_i$ represents a change in Coulomb interaction energy when an i-th two-level system is doubly occupied by tunneling of an electron from an adjacent two-level system,
wherein $U_{av}$ is the average of value of $\tilde{U}_1, \tilde{U}_2, \tilde{U}'_2,$ and $\tilde{U}_3$,
wherein $\tilde{U}'_2$ corresponds to when the second two-level system is doubly occupied by tunneling of an electron from the first two-level system, and
wherein $\tilde{U}_2$ corresponds to when the second two-level system is doubly occupied by tunneling of an electron from the third two-level system.

6. The system of claim 5,
wherein interactions between adjacent two-level systems comprise exchange coupling,
wherein the first two-level system is coupled to the second two-level system via a first tunnel coupling, $t_l$, and the third two-level system is coupled to the second two-level system via a second tunnel coupling, $t_r$, and
the control adjusts $t_l$ and $t_r$ while simultaneously maintaining both tunnel couplings $t_l$ and $t_r$ in an on state in order to perform a single qubit gate operation.

7. The system of claim 5, wherein each two-level system comprises a quantum dot.

8. The system of claim 5, further comprising:
a second three-spin qubit with fourth through sixth two-level systems having respective local potentials $\varepsilon_4$ through $\varepsilon_6$ and coupled to the first qubit via tunnel coupling, $t_c$,
wherein the circuitry of the controller is further programmed to control both the first and second qubits and tunnel coupling, $t_c$, in performing the two-qubit gate operation,
wherein the second qubit is also characterized by a pair of non-trivial detuning parameters representing energy differences between respective energy levels of the two-level systems of the second qubit, and
wherein the circuitry of the controller is programmed to control local potentials of the two-level systems of the second qubit such that derivatives of a respective frequency of the qubit with respect to each detuning parameter are within $10^{-3}$ of zero.

9. The system of claim 5, wherein the circuitry of the controller is programmed to, during a gate operation, control the respective local potentials, $\varepsilon_1$ through $\varepsilon_3$, of the first through third two-level systems to be within $0.1\ U_{av}$ of each other.

10. The system of claim 5, wherein each of the first through third two-level systems is occupied by a respective electron.

11. The system of claim 10, wherein the circuitry of the controller is programmed to control the qubit such that a charge configuration is (1,1,1) throughout the performing the single qubit gate operation or the two-qubit gate operation.

12. The system of claim 5, wherein the controller is configured to apply no more than four electrical pulses to the qubit to perform the single qubit gate operation.

13. The system of claim 5, wherein the controller is configured to apply a single electrical pulse to control a coupling connecting the qubit to an adjacent qubit to perform the two-qubit gate operation.

14. The system of claim 9, wherein the circuitry of the controller is further programmed to, during a readout or initialization operation, control the respective local potentials, $\varepsilon_1$ through $\varepsilon_3$, of the first through third two-level systems such that at least one of the local potentials differs from another of the local potentials by more than $0.1\ U_{av}$.

15. The system of claim 5, wherein, in performing the single qubit gate operation or the two-qubit gate operation, the controller is configured to apply pairwise exchange pulses to the qubit or qubits while maintaining the tunnel couplings to be non-zero.

16. The system of claim 5, wherein the circuitry of the controller is further programmed to idle the qubit by controlling the tunnel couplings to be nonzero and the local potentials to be within $0.1\ U_{av}$ of each other, wherein $U_{av}$ is an average of Coulomb interaction energies for the two-level systems of the qubit.

* * * * *